United States Patent [19]
Lichterfield

[11] Patent Number: 6,046,650
[45] Date of Patent: Apr. 4, 2000

[54] OSCILLATOR CIRCUIT HAVING OPTIMIZED FREQUENCY MODULATION CIRCUIT

[75] Inventor: Stefan Lichterfield, Taunusstein, Germany

[73] Assignee: Motorola, Inc., Schaumburg, Ill.

[21] Appl. No.: 09/062,044

[22] Filed: Apr. 17, 1998

[51] Int. Cl.[7] ............... H03C 3/09; H03C 3/22; H03B 5/12

[52] U.S. Cl. .................... 332/123; 331/117 FE; 331/177 V; 332/136

[58] Field of Search ................. 332/123, 124, 332/135, 136; 331/117 R, 117 FE, 177 V

[56] References Cited

U.S. PATENT DOCUMENTS 4,510,465  4/1985  Rice et al. ..................... 332/136

*Primary Examiner*—Siegfried H. Grimm
*Attorney, Agent, or Firm*—Frank M. Scutch, III

[57] ABSTRACT

A voltage controlled oscillator circuit (58) having a modulation input port (60) for receiving a modulation input signal through modulation circuit (62, 64, 66, 68) and a frequency resonator circuit (28, 74, 76, 80, 82, 84) operable coupled to the modulation input port (60) for providing a modulation dependent impedance. A semiconductor element (90) has three ports, a gate port (98), a source port (96) and a drain port (92), and the modulation circuit is operably coupled to the gate port (98) of the field effect transistor (90) via a first capacitance (70) and the source port (96) of the field effect transistor (90) via a second capacitance (71). This enables the modulation sensitivity to be substantially independent of temperature variations of circuit elements.

4 Claims, 3 Drawing Sheets

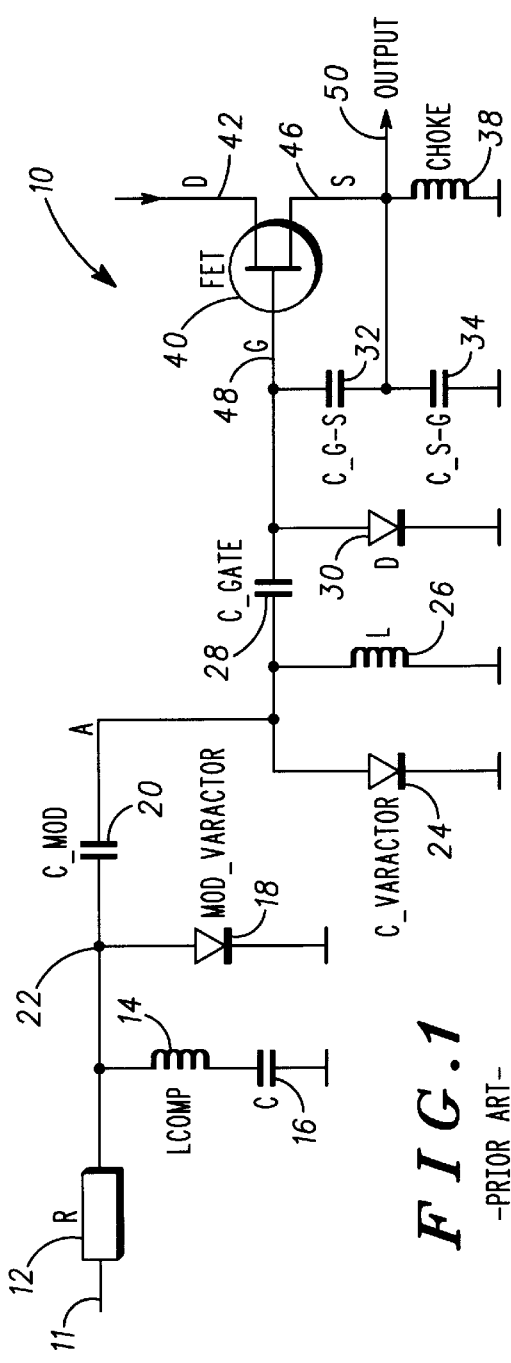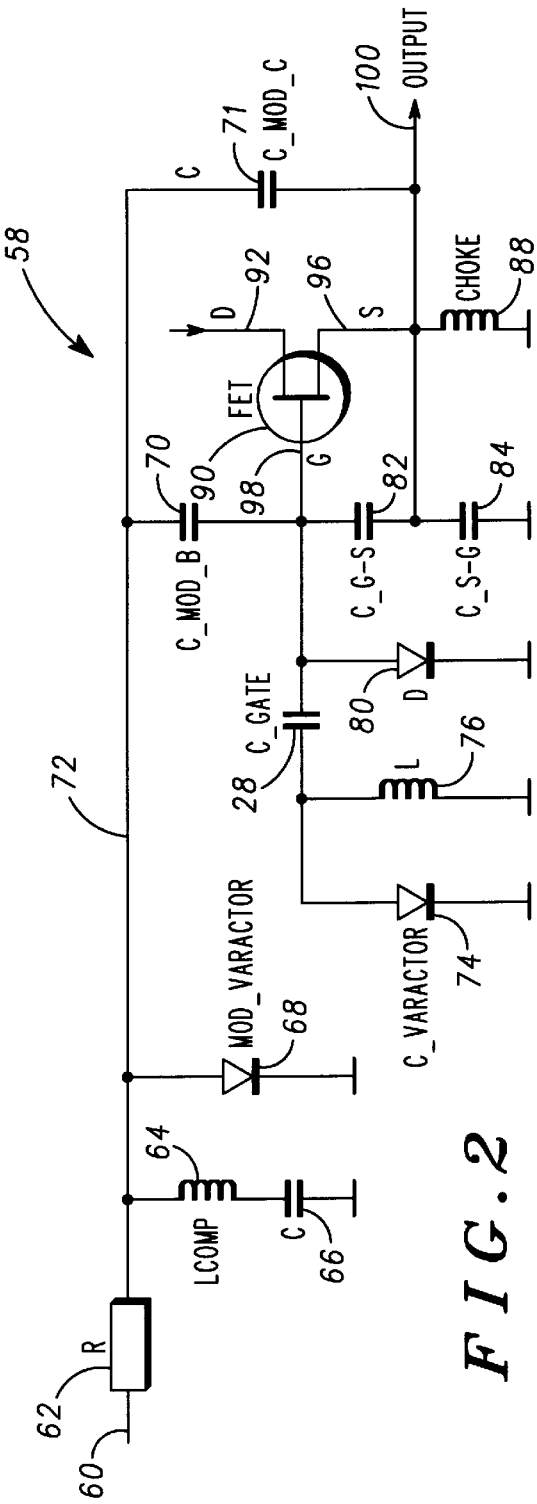
FIG.1 -PRIOR ART-
FIG.2 ated with a defined modulation deviation in order to transmit a given amount of information. To meet specification requirements this deviation may not exceed lower or upper limits over a specified frequency range and temperature variation. As there are a number of complicated effects that have an impact on the modulation deviation performance, a trade off between expected stability and expensive specific components has to be found. This is particularly the case with field effect transistor (FET) oscillators where such trade offs limit the performance in wideband VCO designs, principally over temperature variation. Hence, there is a need to fully compensate for this temperature dependency in the frequency generation design.

OSCILLATOR CIRCUIT HAVING OPTIMIZED FREQUENCY MODULATION CIRCUIT

FIELD OF THE INVENTION

This invention relates to frequency-generating oscillator circuits.

The invention is applicable to, but not limited to, voltage controlled oscillator circuits for radio communication units and method of operating said voltage controlled, oscillator circuits.

BACKGROUND OF THE INVENTION

The signal generation circuitry for mobile radios is a complex process with component cost and component count issues being of high priority in the mobile radio design. One typical arrangement to generate frequencies in mobile radio units is to use voltage controlled oscillator (VCO) designs. Frequency modulation circuits require VCO output signals to be modulated with a defined modulation deviation in order to transmit a given amount of information. To meet specification requirements this deviation may not exceed lower or upper limits over a specified frequency range and temperature variation. As there are a number of complicated effects that have an impact on the modulation deviation performance, a trade off between expected stability and expensive specific components has to be found. This is particularly the case with field effect transistor (FET) oscillators where such trade offs limit the performance in wideband VCO designs, principally over temperature variation. Hence, there is a need to fully compensate for this temperature dependency in the frequency generation design.

A typical prior art frequency generator circuit 10, often termed a frequency resonator tank circuitry is shown in FIG. 1. The frequency resonation is formed by an inductance 26, a voltage variable capacitance 24 and further inductive and capacitive elements. A FET 40 is coupled to the frequency resonator tank circuit via a gate capacitance 28. A capacitive Colpitts divider 32, 34 between the gate-source port and the source-ground port of the FET 40—"Cgs" and "Csg"—adds positive feedback for oscillation generation. An inductive choke 38 isolates the RF signal at source in the DC path from ground. A diode 30 rectifies the peak RF amplitude to generate a negative gate voltage which forms an automatic gain control function (AGC) for the feedback amplification to set the oscillation amplitude to a defined, and not clamped level. The RF output signal is available at the source port 46.

To modulate the frequency being generated by the frequency resonator tank circuit, a modulation signal 11 is routed via resistor 12 to inductor 14, capacitor 16 and modulation varactor 18. Dependent upon the impedance of the modulation capacitor 20, modulation amplitude and component characteristics, the circuit represents a modulation dependent impedance and provides a modulation impedance signal 22 to the resonator tank circuit. The modulation circuit is connected to port A, for best coupling to the resonator tank circuitry or to the FET source port 46 for reduced modulation coupling.

As previously highlighted, a major disadvantage with optimising such VCO circuitry is with the varying modulation deviation sensitivity with respect to varying temperature. Typically, the modulation-temperature performance requires a significant amount of measurements to be taken of both the modulation and resonator tank circuits. Consequently, optimisation of such circuits with regard to temperature variation is often neglected resulting in over or under compensation of the modulation sensitivity of the frequency generation circuits.

Furthermore, in known designs, the modulation capacitance 20 coupling the modulation circuit to the resonator tank circuit is chosen as a special component with suitable temperature factor, for example a Murata N750 type capacitor (750 parts per million capacitance variation if the circuit indicates a positive temperature characteristic), to stabilise the VCO performance. This requires a unique component and consequently an extra reel in any automatic production process. Additionally it is often a critical aspect of the VCO design to use a specific highly specified component with the desired temperature compensation factor, to avoid the performance being degraded.

This invention seeks to provide a voltage controlled oscillator circuit, and method of optimisation for such a voltage controlled oscillator circuit, to mitigate at least some of the problems highlighted above.

SUMMARY OF THE INVENTION

In a first aspect of the present invention, a voltage controlled oscillator (VCO) circuit is provided. The VCO circuit includes a modulation input port for receiving a modulation input signal where it is applied to a modulator circuit and frequency resonator circuit for providing a modulation dependent impedance. A semiconductor element has three ports, preferably a field effect transistor having a gate port, a source port and a drain port, and the frequency resonator circuit is operably coupled to the gate port of the field effect transistor via a first capacitance and the source port of the field effect transistor via a second capacitance.

Preferably, the first capacitance and second capacitance are obtained by determining a capacitive relationship between the gate port and the source port of the field effect transistor over oscillation amplitude of the input signal.

In this manner, the modulation sensitivity is able to be substantially independent of temperature variations of circuit elements.

In a second aspect of the present invention, a method of providing a frequency modulated signal is provided. The method includes the steps of generating an unmodulated input signal, applying the unmodulated input signal to a frequency dependent circuit to provide a modulated output signal and applying the modulated output signal to at least two ports of a semiconductor element to generate a frequency modulated signal where the modulation sensitivity is substantially independent of temperature dependent drifting.

A preferred embodiment of the invention will now be described, by way of example only, with reference to the drawings.

BRIEF DESCRIPTION OF THE DRAWINGS

FIG. 1 is a prior art voltage controlled oscillator circuit.

FIG. 2 is a voltage controlled oscillator circuit according to a preferred embodiment of the invention.

DETAILED DESCRIPTION OF THE DRAWINGS

Figure 3:
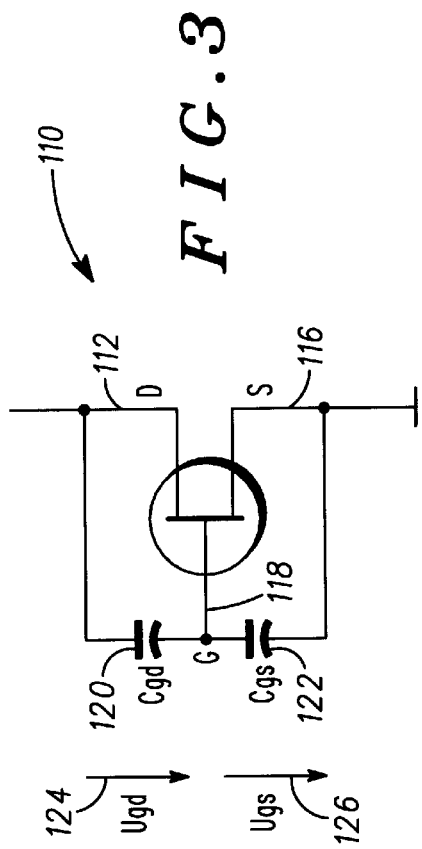
FIG. 3 shows an equivalent circuit of a FET according to the preferred embodiment of the invention.

Referring first to FIG. 2, a block diagram of a voltage controlled oscillator circuit 58 according to a preferred embodiment of the invention, is shown. The voltage controlled oscillator circuit 58 includes a frequency resonation circuit formed by an inductance 76, a voltage variable capacitance 74 and further inductive and capacitive elements. A FET 90 is coupled to the frequency resonator tank circuit via a gate capacitance 28. A capacitive Colpitts divider 82, 84 between the gate-source port and the source-ground port of the FET 90—"Cgs" and "Csg"—adds positive feedback for oscillation generation. An inductive choke 88 isolates the RF signal at source in the DC path from ground. A diode 80 rectifies the peak RF amplitude to generate a negative gate voltage which forms an automatic gain control function (AGC) for the feedback amplification to set the oscillation amplitude to a defined, and not clamped level. The RF output signal is available at the source port 96.

To modulate the frequency being generated by the frequency resonator tank circuit, a modulation signal 60 is routed via resistor 62 to inductor 64, capacitor 66 and modulation varactor 68. Dependent upon the impedance of the modulation capacitance B 70, modulation capacitance C 71, modulation amplitude and other component characteristics, the circuit represents a modulation dependent impedance and provides a modulation impedance signal 72 to the resonator tank circuit. However, the modulation circuit is now connected to both the gate port 98 of the FET 90 via modulation capacitance B 70 and also to the source port 96 of the FET 90 via modulation capacitance C 71.

In the preferred embodiment of the invention, the first capacitance, modulation capacitance B 70, and second capacitance, modulation capacitance C 71, are obtained by determining a capacitive relationship between the gate port 98 and the source port 96 of the field effect transistor 90 when the amplitude of the input signal is varied.

In operation, it can be shown that a two port modulation of modulation impedance to the gate port 98 and the source port 96 of the FET 90 in FIG. 2, is designed such that the ratios of the capacitor values compensate for any unwanted modulation sensitivity drift over temperature of the oscillator circuit 58. One advantage being that no special series of component has to be used and fine-tuning is possible by varying both capacitor values.

In the preferred embodiment of the invention, the voltage controlled oscillator circuit is described with reference to a FET. However, it is within the contemplation of the invention that the compensating effect also works with any driver element, for example a bipolar device or indeed any semiconductor element which has a non-constant input impedance versus oscillator amplitude and temperature performance. Furthermore, even higher frequency semiconductor devices, for example silicon devices, operating in the gigahertz (GHz) frequency range will benefit from the inventive concept described herein The voltage controlled oscillator circuit in the preferred embodiment of the invention is described with particular reference to its operation in a radio communication unit.

Referring now to FIG. 3, an equivalent circuit of a field effect transistor (FET) 110 is shown. The FET 110 has three ports: a drain port D 112, a source port S 116 and a gate port G 118. The drain port D 112 is connected to a drain supply voltage Ud. In the equivalent circuit of a FET 110, the drain port D 112 is connected to the gate port G 118 via a gate-drain capacitance Cgd 120 having a voltage Ugd 124 across it. The gate port G 118 is connected to the source port S 116 via a gate-source capacitance Cgs 122 having a voltage Ugs 126 across it. The source port S 116 is also connected to ground. Ugs is negative as described above, typically 0 to −3V in an oscillator circuit where Ud=10V. This value is dependent upon the FET amplitude and gain performance as a function of temperature. In such a circuit Ugd then varies from 10V to 13V. It has been determined that the forward steepness S21 of a FET decreases with rising temperature. This results in a lower RF amplitude swing and therefore in a detected negative gate voltage that is less negative at higher temperatures. The gate-source capacitance Cgs 122 of a FET varies with the gate-source voltage Ugs 126 similar to the performance of a varactor diode. As available S-parameter sets do not describe this effect there was no mathematical solution available. Table 1 given below shows the measured values for the gate-source capacitance Cgs 122 and gate-drain capacitance Cgd 120 of a FET sample MBFU310.

TABLE 1

| Ugsd/V | Cgs/pF | Cdg/pF |
|---|---|---|
| 0 | 12.00 | 12.00 |
| −1 | 7.90 | 8.00 |
| −2 | 6.00 | 5.95 |
| −3 | 3.80 | 3.50 |
| −4 | 2.85 | 2.63 |
| −5 | 2.28 | 2.10 |
| −6 | 1.90 | 1.75 |
| −7 | 1.63 | 1.50 |
| −8 | 1.43 | 1.31 |
| −9 | 1.27 | 1.17 |
| −10 | 1.14 | 1.05 |
| −11 | 1.04 | 0.95 |
| −12 | 0.95 | 0.88 |
| −13 | 0.88 | 0.81 |

Figure 4:
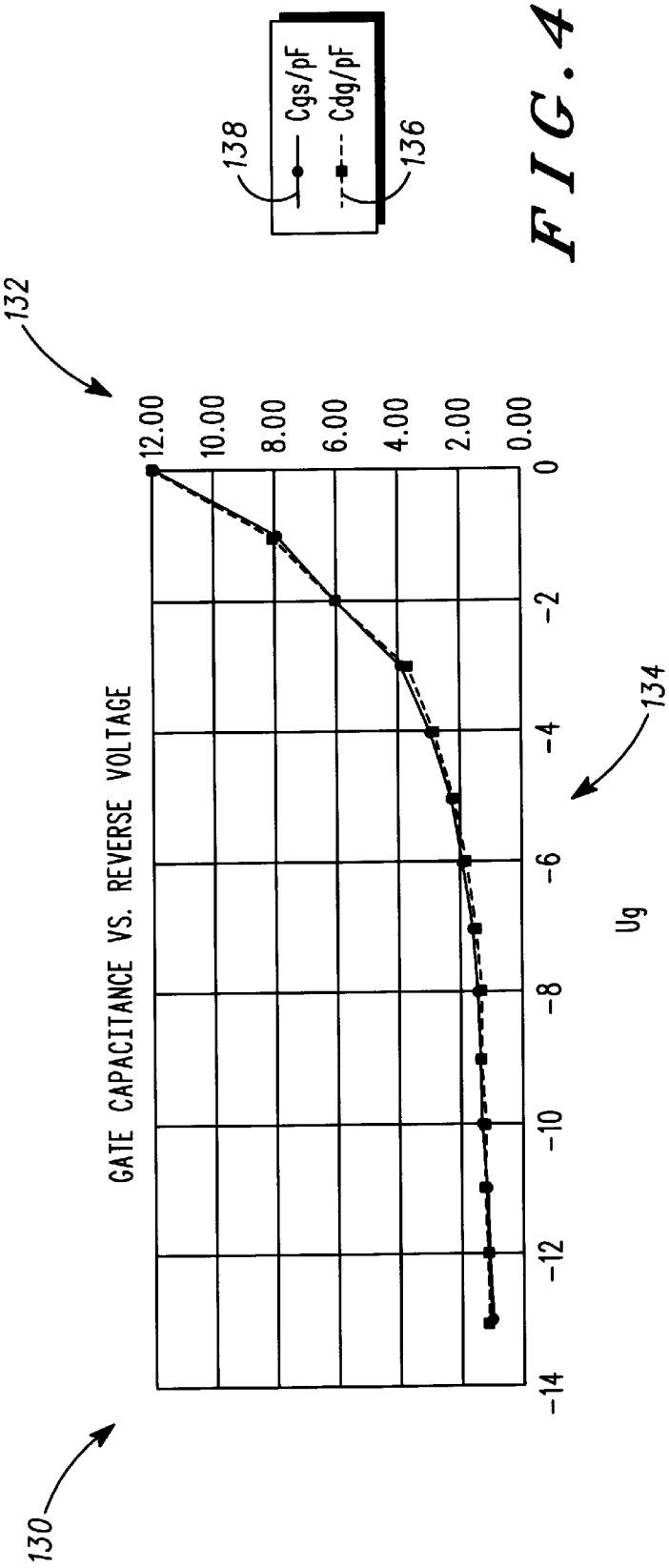
FIG. 4 shows a graph of a FET gate capacitance versus reverse voltage according to the preferred embodiment of the invention.

These values are shown more clearly in FIG. 4. FIG. 4 shows a graph 130 of a FET gate capacitance versus reverse voltage according to the preferred embodiment of the invention. Two capacitance values are plotted against reverse voltage Ug 134—gate-source capacitance Cgs 138 and gate-drain capacitance Cgd 136 with the capacitance values provided in picoFarads pF 132.

With precise measurements done on FET samples such gate capacitance data can be extracted and added to the FET VCO model. As Ugd is much larger than Ugs, Cgd is low (<1 pF) and will vary less from—10 to −13 V than Cgs from 0 to −3V does (4–12 pF). It can be shown that the varying Cgs capacitance forms a temperature dependent voltage divider for the modulation signal. Cgd varies much less and can therefore be neglected.

Hence, providing a modulation input signal at A or B enables the gate-source capacitance Cgs to divide the modulation signal's modulation impedance down to ground via Cgs. This results in a decreased modulation deviation with rising Cgs at higher temperature. With a modulation input signal provided at C, the gate-source capacitance Cgs will increase the coupling of the modulation impedance to the tank circuit.

This results in increased modulation deviation with rising Cgs at higher temperatures.

To find the best balance of the impact of both modulation capacitance B 70 and modulation capacitance C 71, in accordance with the arrangement described in FIG. 2, the oscillator designer has to measure the VCOs gate voltage Ugs once on a typical circuit at its extreme operation temperatures. With the available FET data of Ugs versus temperature, its Cgs value can be determined and implemented in a simulation model. Subsequently, the balance values of modulation capacitance B 70 (Cmod_b) and modulation capacitance C 71 (Cmod_c) have to be calculated using a suitable mathematical optimisation tool. With the extracted FET parameters of Cgs over oscillation amplitude, which is a function of temperature, it can be shown that a two port modulation of modulation impedance to the gate port 98 and the source port 96 of the FET 40 in FIG. 2, will compensate for any unwanted modulation sensitivity drift over temperature. Therefore utilising two modulation capacitances in such a manner provides the appropriate modulation deviation drift compensation with the advantage that no special series of components have to be used and fine-tuning is possible by varying both capacitors.

Figure 5:
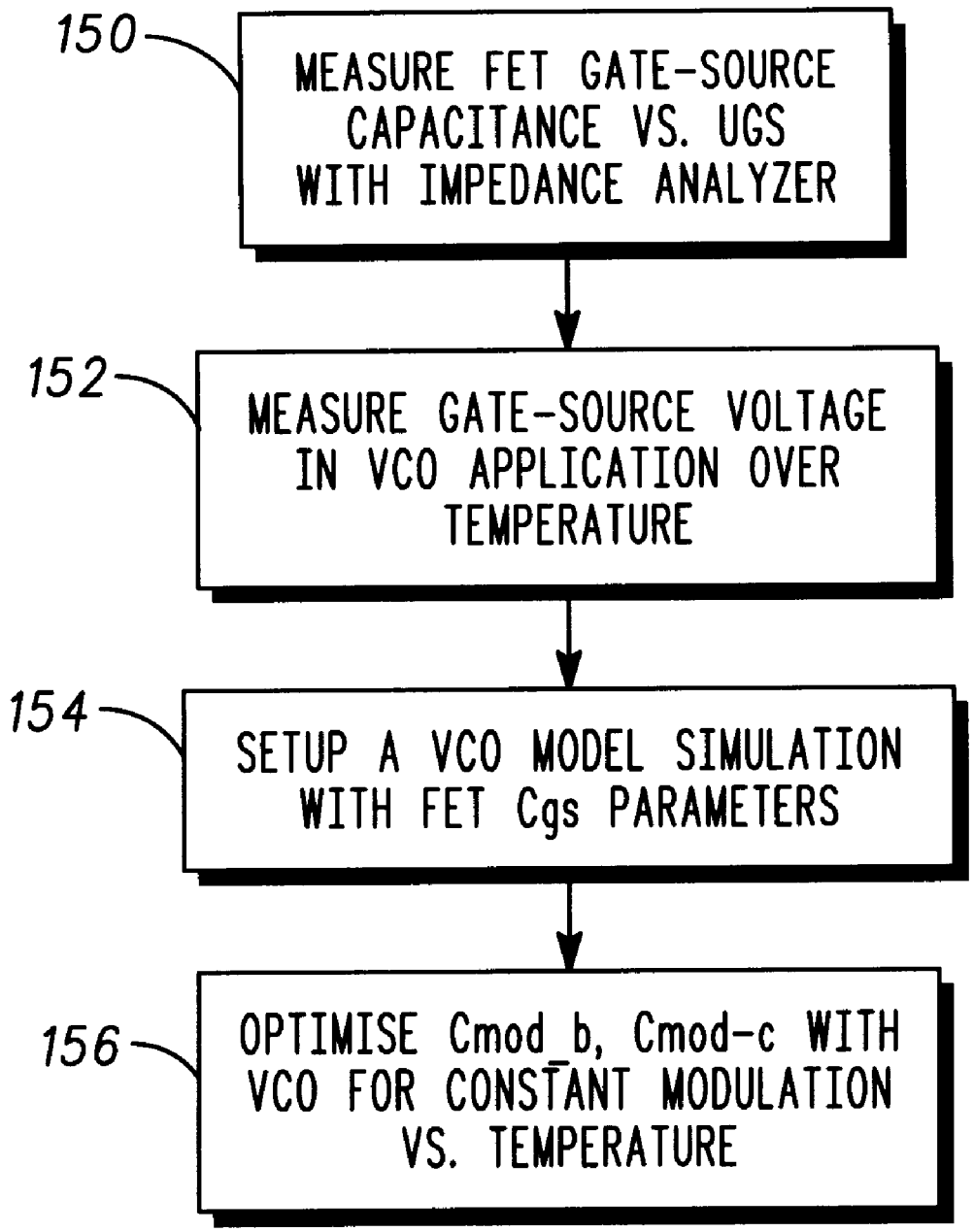
FIG. 5 is a flow chart showing a method for operating the voltage controlled oscillator circuit in a transceiver according to a preferred embodiment of the invention.

Referring now to FIG. 5, a flow chart showing a method for optimising the voltage controlled oscillator circuit is provided according to a preferred embodiment of the invention. The method for optimising the voltage controlled oscillator circuit includes measuring the FET gate-source capacitance Cgs relationship with the gate-source voltage Ugs, for example with an impedance analyser, as in step 150. The gate-source voltage is measured over temperature once the VCO final design has been completed, as shown in step 152. A VCO model is simulated that includes the FET Cgs measured values, as in step 154 and the model optimised to determine optimal Cmod_c and Cmod_b values to ensure constant modulation across the desired temperature range, as shown in step 156.

Thus a voltage controlled oscillator circuit and method of optimising the design of the voltage controlled oscillator circuit are provided that mitigate a number of problems associated with prior art oscillator circuits.

What is claimed is:

1. A voltage controlled oscillator circuit (58) comprising:
    a modulation input port (60) for receiving a modulation input signal;
    a frequency resonator circuit operably coupled to the modulation input port for (60) providing a modulation dependent impedance; and
    a semiconductor element (90) having at least three ports,
    characterized in that the frequency resonator circuit is operably coupled to a first port (98) of the semiconductor element (90) via a first capacitance (70) and a second port (96) of the semiconductor element (90) via a second capacitance (71) wherein the first capacitance and second capacitance are related such that modulation sensitivity drift due to temperature variation in the voltage controlled oscillator circuit is substantially nullified.

2. A voltage controlled oscillator circuit according to claim 1, wherein the semiconductor element is a field effect transistor and the first port is a gate port and the second port is a source port of the field effect transistor.

3. A voltage controlled oscillator circuit according to claim 1, wherein the first capacitance and second capacitance are obtained by determining a capacitive relationship between a gate port and a source port of the semiconductor element over a measured amplitude of the input signal.

4. A method of providing a frequency modulated signal comprising the steps of:
    generating a modulation input signal;
    connecting at least one semiconductor element with a resonant circuit to form an oscillator circuit;
    applying the modulation input signal to at least two ports of the semiconductor element to generate a frequency modulated signal from the oscillator circuit where the modulation sensitivity is substantially independent of temperature dependent drifting.

\* \* \* \* \*